(12) United States Patent
Liu et al.

(10) Patent No.: US 9,099,565 B2
(45) Date of Patent: Aug. 4, 2015

(54) METHOD OF MAKING A SEMICONDUCTOR DEVICE USING TRENCH ISOLATION REGIONS TO MAINTAIN CHANNEL STRESS

(71) Applicant: STMicroelectronics, Inc., Coppell, TX (US)

(72) Inventors: Qing Liu, Guilderland, NY (US); Nicolas Loubet, Guilderland, NY (US)

(73) Assignee: STMICROELECTRONICS, INC., Coppell, TX (US)

( * ) Notice: Subject to any disclaimer, the term of this patent is extended or adjusted under 35 U.S.C. 154(b) by 9 days.

(21) Appl. No.: 14/048,282

(22) Filed: Oct. 8, 2013

(65) Prior Publication Data
US 2015/0099335 A1    Apr. 9, 2015

(51) Int. Cl.
*H01L 21/00* (2006.01)
*H01L 21/84* (2006.01)
*H01L 21/8238* (2006.01)
*H01L 27/092* (2006.01)
*H01L 27/12* (2006.01)

(52) U.S. Cl.
CPC *H01L 21/823878* (2013.01); *H01L 21/823807* (2013.01); *H01L 21/84* (2013.01); *H01L 27/0924* (2013.01); *H01L 27/1203* (2013.01)

(58) Field of Classification Search
CPC ............. H01L 21/823807; H01L 27/1203; H01L 29/7848; H01L 21/823814; H01L 29/7842; H01L 29/1054; H01L 29/165; H01L 27/1207; H01L 21/02532; H01L 21/76283; H01L 21/7624; H01L 27/0922; H01L 29/4908

See application file for complete search history.

(56) References Cited

U.S. PATENT DOCUMENTS

| | | | | |
|---|---|---|---|---|
| 7,238,580 | B2 * | 7/2007 | Orlowski et al. | 438/300 |
| 7,388,259 | B2 * | 6/2008 | Doris et al. | 257/351 |
| 2006/0001089 | A1 * | 1/2006 | Bedell et al. | 257/347 |
| 2006/0022268 | A1 * | 2/2006 | Oh et al. | 257/347 |
| 2007/0015347 | A1 * | 1/2007 | Mehta et al. | 438/514 |
| 2007/0196987 | A1 * | 8/2007 | Chidambarrao et al. | 438/285 |
| 2007/0254423 | A1 * | 11/2007 | Chidambarrao et al. | 438/197 |
| 2008/0296692 | A1 * | 12/2008 | Griebenow et al. | 257/368 |
| 2008/0303090 | A1 * | 12/2008 | Ieong et al. | 257/351 |
| 2009/0236663 | A1 * | 9/2009 | Teo et al. | 257/347 |
| 2010/0047985 | A1 * | 2/2010 | Dakshina Murthy et al. | 438/303 |
| 2010/0109044 | A1 * | 5/2010 | Tekleab et al. | 257/190 |
| 2010/0171180 | A1 * | 7/2010 | Zhang et al. | 257/369 |
| 2013/0217198 | A1 | 8/2013 | Anderson et al. | |

* cited by examiner

*Primary Examiner* — Bac Au
(74) *Attorney, Agent, or Firm* — Allen, Dyer, Doppelt, Milbrath & Gilchrist, P.A.

(57) ABSTRACT

A method for forming a complementary metal oxide semiconductor (CMOS) semiconductor device includes forming laterally adjacent first and second active regions in a semiconductor layer of a silicon-on-insulator (SOI) wafer. A stress inducing layer is formed above the first active region to impart stress thereto. Trench isolation regions are formed bounding the first active region and adjacent portions of the stress inducing layer. The stress inducing layer is removed leaving the trench isolation regions to maintain stress imparted to the first active region.

25 Claims, 4 Drawing Sheets

METHOD OF MAKING A SEMICONDUCTOR DEVICE USING TRENCH ISOLATION REGIONS TO MAINTAIN CHANNEL STRESS

FIELD OF THE INVENTION

The present invention relates to the field of electronic devices, and more particularly, to a method of making semiconductor devices.

BACKGROUND OF THE INVENTION

Some semiconductor devices utilize semiconductor-on-insulator (SOI) technology, in which a thin layer of a semiconductor, such as silicon, is separated from a semiconductor substrate by a relatively thick electrically insulating layer. This thick electrically insulating layer is also referred to as a buried oxide (BOX) layer. The semiconductor layer typically has a thickness of a few nanometers, whereas the semiconductor substrate typically has a thickness of a few tens of nanometers.

SOI technology offer certain advantages compared to traditional bulk technology for Complementary Metal Oxide Semiconductor (CMOS) devices. CMOS devices include nMOSFET transistors and pMOSFET transistors both formed in the thin silicon layer which overlies the buried oxide (BOX) layer. SOI technology allows CMOS devices to operate at a lower power consumption while providing the same performance level.

One particular type of SOI technology that is helping to allow for continued CMOS scaling is fully depleted SOI (FDSOI). As opposed to a partially depleted SOI (PDSOI) device, in an FDSOI device a relatively thin semiconductor channel layer is provided over the buried oxide (BOX) layer, such that the depletion region of the device covers the whole layer. FDSOI devices may provide advantages such as higher switching speeds and a reduction in threshold voltage roll off, as compared to PDSOI devices, for example.

To improve CMOS device performance, stress may be introduced into the channels of the field effect transistors (FETs). When applied in a longitudinal direction (i.e., in the direction of current flow), tensile stress is known to enhance electron mobility (i.e., n-channel FET drive currents) while compressive stress is known to enhance hole mobility (i.e., p-channel FET drive currents).

Typical methods for enhancing channel stress in a semiconductor device involve the use of a blanket implantation across an entire semiconductor substrate. A more localized implantation approach is disclosed in U.S. published patent application no. 2013/0217198. A localized implant into a gate region prior to gate etch is performed for enhancing the channel stress of the semiconductor device.

Another approach for enhancing channel stress in a semiconductor device involves embedding source/drain stressor material in stress cavities in the source/drain regions of a MOSFET. Silicon germanium (SiGe) may be used in pMOSFETs to induce compressive strain in the channel region, and silicon carbide (SiC) may be used in nMOSFETs to induce tensile strain in the channel region. The source/drain stressor material may be heavily doped in-situ to avoid implant damage to the stressor that can degrade the channel stress.

Despite the existence of such configurations, further enhancements in SOI devices may be desirable in some applications.

SUMMARY OF THE INVENTION

A method for forming a complementary metal oxide semiconductor (CMOS) semiconductor device includes forming laterally adjacent first and second active regions in a semiconductor layer of a silicon-on-insulator (SOI) wafer, forming a stress inducing layer above the first active region to impart stress thereto, and forming trench isolation regions bounding the first active region and adjacent portions of the stress inducing layer. The stress inducing layer may be removed leaving the trench isolation regions to maintain stress imparted to the first active region.

Stress may advantageously enhance electron mobility within the first active region, for example. The stress is based on a lattice mismatch at an interface between the stress inducing layer and the first active region. The trench isolation regions advantageously hold or freeze the first active region in a stressed state, and may extend downwardly into the SOI wafer past a buried oxide layer thereof.

The first active region may comprise a first semiconductor material, and the second active region and the stress inducing layer may each comprise a second semiconductor material. For example, the first semiconductor material may comprise silicon, and the second semiconductor material may comprise silicon and germanium.

The method may further comprise forming a mask layer over the second active region before forming the stress inducing layer above the first active region. The stress inducing layer may have a greater thickness than the mask layer. To densify the trench isolation regions, a high temperature anneal may be performed after the stress inducing layer has been removed.

The method may further comprise forming first and second gate stacks over the first and second active regions, respectively. First raised source and drain regions defining a first channel therebetween may be formed in the first active region under the first gate stack. Second raised source and drain regions defining a second channel therebetween may be formed in the second active region under the second gate stack.

DETAILED DESCRIPTION OF THE PREFERRED EMBODIMENTS

The present embodiments will now be described more fully hereinafter with reference to the accompanying drawings, in which preferred embodiments are shown. The embodiments may, however, be embodied in many different forms and should not be construed as limited to the embodiments set forth herein. Rather, these embodiments are provided so that this disclosure will be thorough and complete, and will fully convey the scope of the disclosure to those skilled in the art. Like numbers refer to like elements throughout.

A method for forming a complementary metal oxide semiconductor (CMOS) semiconductor device will now be discussed in reference to the flowchart 20 in FIG. 1 and to the process flow illustrated in FIGS. 2-5.

As will be discussed in greater detail below, a stress inducing layer is formed above a first active region in a semiconductor layer of a silicon-on-insulator (SOI) wafer to stress the first active region. The stress is based on a lattice mismatch at an interface between the stress inducing layer and the first active region. To hold or freeze the first active region in a strained state, trench isolation regions are formed bounding the first active region before the stress inducing layer is removed.

Figure 1:
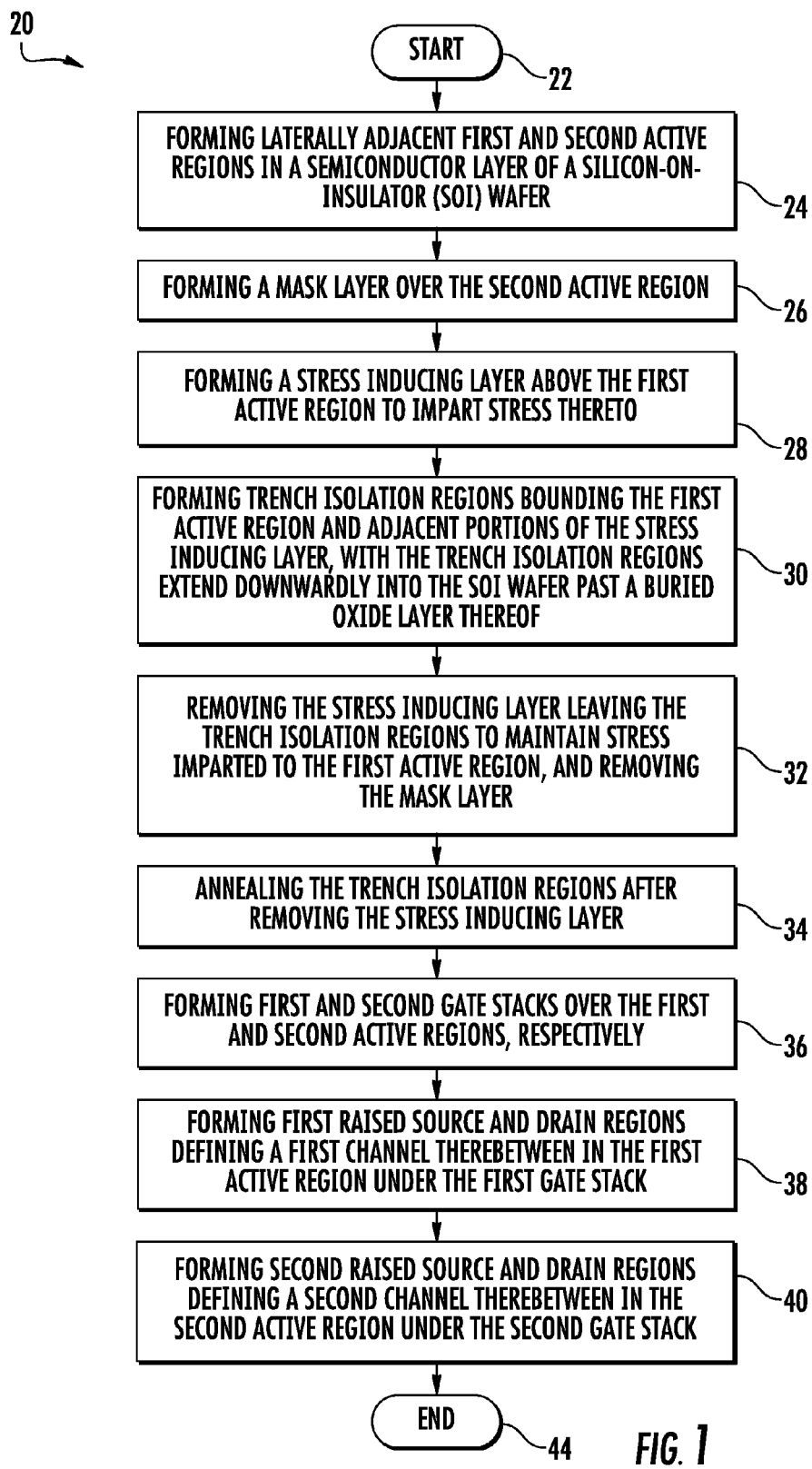
FIG. 1 is a flowchart illustrating a method for forming a complementary metal oxide semiconductor (CMOS) semiconductor device in accordance with the present embodiment.
Figure 2:
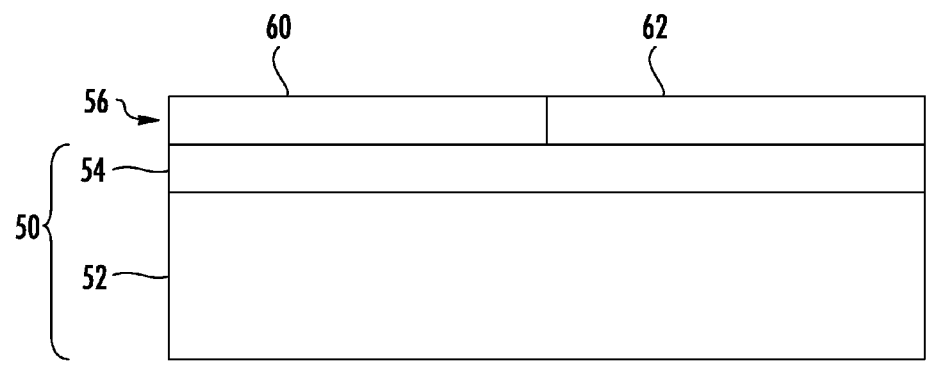
FIGS. 2-5 are a series of cross-sectional diagrams illustrating the method of FIG. 1.

Referring initially to the flowchart 20 in FIG. 1 and to the process flow illustrated in FIG. 2, the method includes, from the start (Block 22), forming at Block 24 laterally adjacent first and second active regions 60, 62 in a semiconductor layer 56 of a silicon-on-insulator (SOI) wafer 50. The SOI wafer 50 includes a semiconductor substrate or wafer 52, a buried oxide (BOX) layer 54 on the semiconductor substrate, and the semiconductor layer 56 on the buried oxide layer. In one embodiment, the semiconductor substrate 52 comprises silicon, and the semiconductor layer 56 also comprises silicon.

The SOI wafer 50 may be a fully depleted SOI (FDSOI) wafer, as readily appreciated by those skilled in the art. In addition, the SOI wafer 50 may be an ultra-thin body and box (UTBB) wafer, as also readily appreciated by those skilled in the art. For example, a thickness of the semiconductor substrate 52 may be within a range of about 10 to 25 nm, and a thickness of the semiconductor layer 56 may be within a range of about 5 to 10 nm.

In the illustrated embodiment, the first active region 60 comprises silicon, and the second active region 62 comprises silicon and germanium. To form the second active region 62, a nitride (mask) layer is formed on the left half of the semiconductor layer 56 corresponding to the first active region 60 and a SiGe layer is epitaxially grown on the right half of the semiconductor layer 56. A rapid thermal oxidation (RTO) is performed to cause germanium condensation into the second active region 62. The nitride (mask) layer is then removed.

Figure 3:
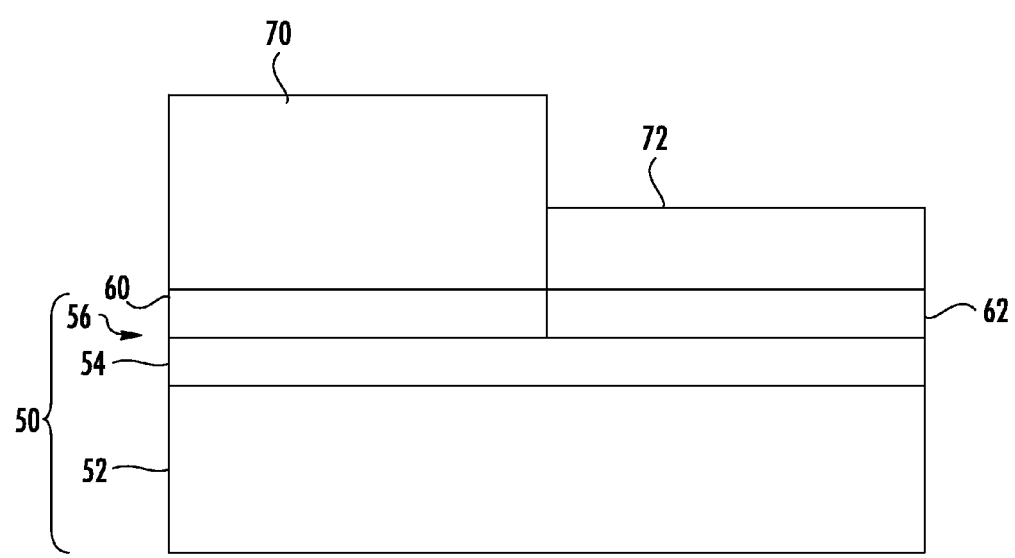

Referring now additionally to FIG. 3, a nitride (mask) layer 72 is formed at Block 26 over the second active region 62. A stress inducing layer 70 is then formed at Block 28 above the first active region 60 to impart stress thereto. In this example embodiment, the stress inducing layer 70 is silicon and germanium.

Because of a lattice mismatch at an interface between the stress inducing layer 70 and the first active region 60, stress in introduced into the first active region. Stress advantageously enhances electron mobility within the first active region 60. Since the first active region 60 is for an n-channel metal-oxide semiconductor field-effect transistor (nMOSFET), the stress inducing layer 70 is also referred to as a tensile stress inducing layer.

The stress inducing layer 70 has a greater thickness than the mask layer 72. A thickness of the mask layer 72 may be within a range of about 15 to 20 nm, and a thickness of the stress inducing layer 70 may be within a range of about 20 to 60 nm, for example. A thicker stress inducing layer 70 places greater strain on the first active region 60.

Figure 4:
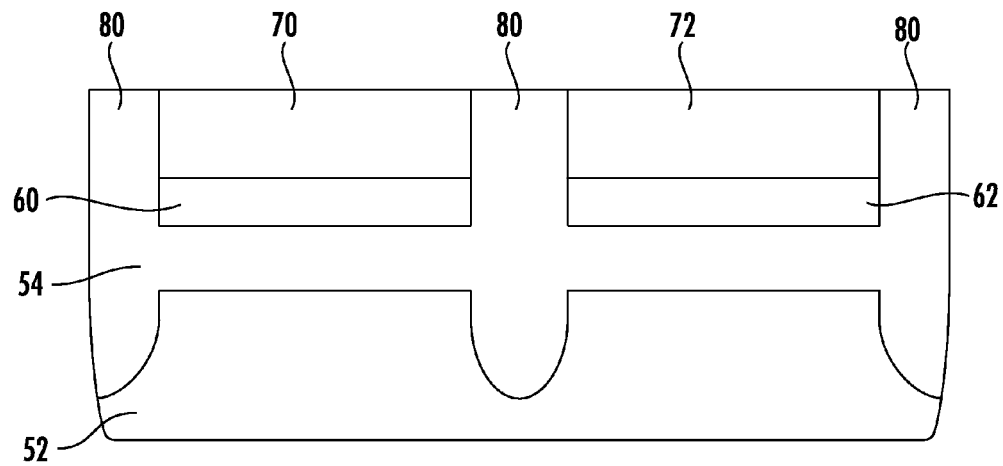

Trench isolation regions 80 are formed at Block 30 to bound the first active region 60 and adjacent portions of the stress inducing layer 70, as illustrated in FIG. 4. Optionally, a chemical-mechanical polishing may be performed before the trench isolation regions 80 so that the stress inducing layer 70 is co-planer with the mask layer 72. In forming the trench isolation regions 80, trenches are formed to extend downwardly into the SOI wafer 50 past the buried oxide layer 54 thereof, and are filled with an oxide. The trench isolation regions 80 thus extend downwardly into the SOI wafer 50 past the buried oxide layer 54 thereof.

The oxide in the trench isolation regions 80 is not annealed in some embodiments so as to prevent the germanium in the stress inducing layer 70 from diffusing into the stressed first active region 60. The oxide in the trench isolation regions 80 advantageously holds or freezes the first active region in a strained state.

If the stress inducing layer 70 is removed before the trench isolation regions 80 are formed, then the first active region 60 may not remain in a stressed state. As illustrated in FIG. 4, the trench isolation regions 80 also bound the second active region 62. After the trench isolation regions 80 have been formed, then the stress inducing layer 70 is removed at Block 32 leaving the trench isolation regions 80 to maintain stress imparted to the first active region 60. The mask layer 72 is also removed.

Figure 5:
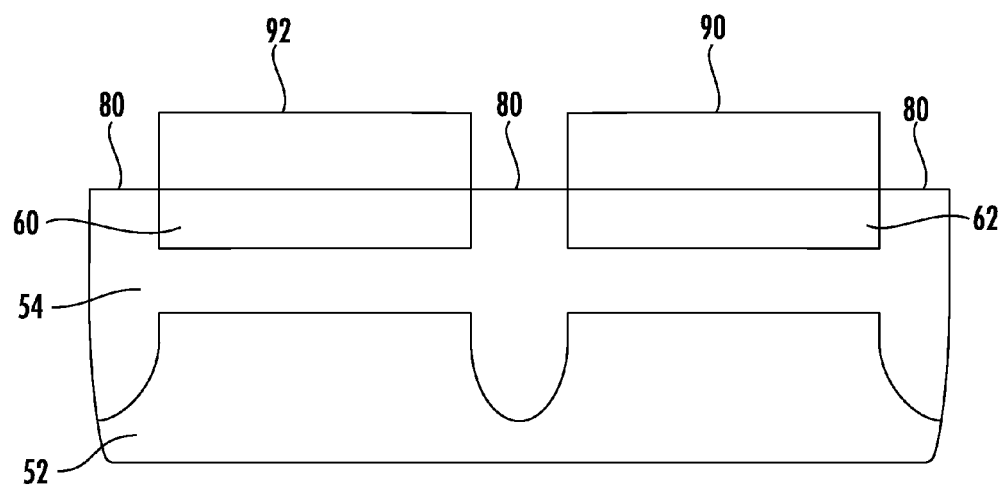

To densify the trench isolation regions 80, a high temperature anneal is performed at Block 34 after the stress inducing layer 70 has been removed. Prior to performing the anneal, a nitride layer 92 is formed over the second active region 62, and an oxide layer 90 is formed over the first active region 60, as illustrated in FIG. 5. After the anneal, the oxide and nitride layers 90, 92 are removed.

Figure 6:
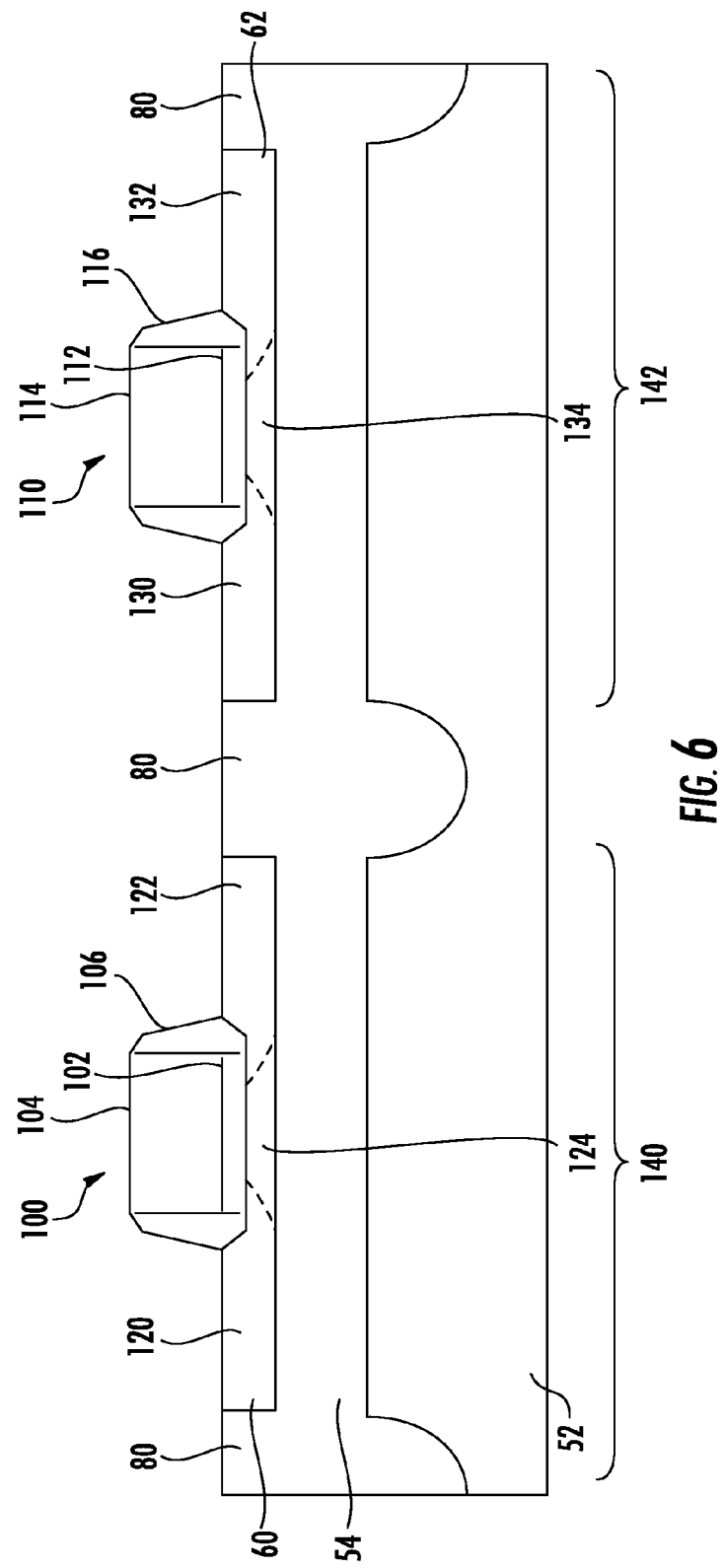
FIG. 6 is a cross-sectional diagram of the CMOS semiconductor device formed by the method of FIG. 1.

The method further comprises forming first and second gate stacks 100, 110 over the first and second active regions 60, 62, respectively, at Block 36. In the illustrated embodiment of the CMOS semiconductor device shown in FIG. 6, the first gate stack 100 includes a gate dielectric layer 102, a gate electrode layer 104, and sidewall spacers 106. Similarly, the second gate stack 110 includes a gate dielectric layer 112, a gate electrode layer 114, and sidewall spacers 116.

First raised source and drain regions 120, 122 are formed at Block 38 to define a first channel 124 therebetween in the first active region 60 under the first gate stack 100. Similarly, second raised source and drain regions 130, 132 are formed at Block 40 to define a second channel 134 therebetween in the second active region 62 under the second gate stack 110.

The first channel region 124 is for an n-channel metal-oxide semiconductor field-effect transistor (nMOSFET) 140, and the second channel region 134 is for a p-channel metal-oxide semiconductor field-effect transistor (pMOSFET) 142. The method ends at Block 42.

In view of the above, a variety of different transistor structures may be implemented, including but not necessarily limited to: planar CMOS, high-k metal gate CMOS, PD-SOI, FD-SOI, UTBB, vertical double gate, buried gate, FinFET, tri-gate, multi-gate, 2D, 3D, raised source/drain, strained source/drain, strained channel, and combinations/hybrids thereof, for example.

Many modifications and other embodiments will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for forming a complementary metal oxide semiconductor (CMOS) semiconductor device comprising:
    forming laterally adjacent first and second active regions in a semiconductor layer of a silicon-on-insulator (SOI) wafer;
    forming a stress inducing layer above the first active region to impart stress thereto, with the first active region comprising a first semiconductor material and the second active region and the stress inducing layer each comprising a second semiconductor material;
    forming trench isolation regions bounding the first active region and adjacent portions of the stress inducing layer; and removing the stress inducing layer leaving the trench isolation regions to maintain stress imparted to the first active region.

2. The method according to claim 1 wherein the first semiconductor material comprises silicon, and the second semiconductor material comprises silicon and germanium.

3. The method according to claim 1 further comprising forming a mask layer over the second active region before forming the stress inducing layer above the first active region.

4. The method according to claim 3 wherein the stress inducing layer has a greater thickness than the mask layer.

5. The method according to claim 1 further comprising annealing the trench isolation regions after removing the stress inducing layer.

6. The method according to claim 1 further comprising:
forming first and second gate stacks over the first and second active regions, respectively;
forming first raised source and drain regions defining a first channel therebetween in the first active region under the first gate stack; and
forming second raised source and drain regions defining a second channel therebetween in the second active region under the second gate stack.

7. The method according to claim 6 wherein the first channel region is for an n-channel metal-oxide semiconductor field-effect transistor (nMOSFET) having a FinFET structure, and the second channel region is for a p-channel metal-oxide semiconductor field-effect transistor (pMOSFET) having a FinFET structure.

8. The method according to claim 1 wherein the SOI wafer comprises a fully depleted SOI (FOSOI) wafer.

9. The method according to claim 1 wherein the stress inducing layer comprises a tensile stress inducing layer.

10. The method according to claim 1 wherein the trench isolation regions extend downwardly into the SOI wafer past a buried oxide layer thereof.

11. A method for forming a complementary metal oxide semiconductor (CMOS) semiconductor device comprising:
forming laterally adjacent first and second active regions in a semiconductor layer of a silicon-on-insulator (SOI) wafer, with the first active region comprising a first semiconductor material and the second active region comprising a second semiconductor material;
forming a stress inducing layer above the first active region to impart stress thereto, with the stress inducing layer comprising the second semiconductor material;
forming trench isolation regions bounding the first active region and adjacent portions of the stress inducing layer, with the trench isolation regions extending downwardly into the SOI wafer past a buried oxide layer thereof; and
removing the stress inducing layer leaving the trench isolation regions to maintain stress imparted to the first active region.

12. The method according to claim 11 wherein the first semiconductor material comprises silicon, and the second semiconductor material comprises silicon and germanium.

13. The method according to claim 11 further comprising forming a mask layer over the second active region before forming the stress inducing layer above the first active region.

14. The method according to claim 13 wherein the stress inducing layer has a greater thickness than the mask layer.

15. The method according to claim 11 further comprising annealing the trench isolation regions after removing the stress inducing layer.

16. The method according to claim 11 further comprising:
forming first and second gate stacks over the first and second active regions, respectively;
forming first raised source and drain regions defining a first channel therebetween in the first active region under the first gate stack; and
forming second raised source and drain regions defining a second channel therebetween in the second active region under the second gate stack.

17. The method according to claim 16 wherein the first channel region is for an n-channel metal-oxide semiconductor field-effect transistor (nMOSFET) having a FinFET structure, and the second channel region is for a p-channel metal-oxide semiconductor field-effect transistor (pMOSFET) having a FinFET structure.

18. The method according to claim 11 wherein the SOI wafer comprises a fully depleted SOI (FDSOI) wafer.

19. A method for forming a complementary metal oxide semiconductor (CMOS) semiconductor device comprising:
forming laterally adjacent first and second active regions in a semiconductor layer of a silicon-on-insulator (SOI) wafer, with the first active region comprising silicon and the second active region comprising silicon and germanium;
forming a stress inducing layer above the first active region to impart stress thereto, with the stress inducing layer comprising silicon and germanium;
forming trench isolation regions bounding the first active region and adjacent portions of the stress inducing layer; and
removing the stress inducing layer leaving the trench isolation regions to maintain stress imparted to the first active region.

20. The method according to claim 19 wherein the trench isolation regions extend downwardly into the SOI wafer past a buried oxide layer thereof.

21. The method according to claim 19 further comprising forming a mask layer over the second active region before forming the stress inducing layer above the first active region.

22. The method according to claim 21 wherein the stress inducing layer has a greater thickness than the mask layer.

23. The method according to claim 19 further comprising annealing the trench isolation regions after removing the stress inducing layer.

24. The method according to claim 19 further comprising:
forming first and second gate stacks over the first and second active regions, respectively;
forming first raised source and drain regions defining a first channel therebetween in the first active region under the first gate stack; and
forming second raised source and drain regions defining a second channel therebetween in the second active region under the second gate stack.

25. The method according to claim 24 wherein the first channel region is for an n-channel metal-oxide semiconductor field-effect transistor (nMOSFET) having a FinFET structure, and the second channel region is for a p-channel metal-oxide semiconductor field-effect transistor (pMOSFET) having a FinFET structure.

* * * * *

UNITED STATES PATENT AND TRADEMARK OFFICE
CERTIFICATE OF CORRECTION

| | |
|---|---|
| PATENT NO. | : 9,099,565 B2 |
| APPLICATION NO. | : 14/048282 |
| DATED | : August 4, 2015 |
| INVENTOR(S) | : Qing Liu and Nicolas Loubet |

It is certified that error appears in the above-identified patent and that said Letters Patent is hereby corrected as shown below:

In the claims

| | |
|---|---|
| Column 5, Line 32, | Delete: "FOSOI" |
| Claim 8 | Insert --FDSOI-- |

Signed and Sealed this
Twenty-second Day of December, 2015

Michelle K. Lee
*Director of the United States Patent and Trademark Office*